(12) United States Patent
    Wu et al.

(10) Patent No.: US 12,550,310 B2
(45) Date of Patent: Feb. 10, 2026

(54) GATE ISOLATION STRUCTURES

(71) Applicant: Taiwan Semiconductor Manufacturing Company, Ltd., Hsin-Chu (TW)

(72) Inventors: Chi-Wei Wu, Hsinchu (TW); Hsin-Che Chiang, Taipei (TW); Jeng-Ya Yeh, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 405 days.

(21) Appl. No.: 18/180,968

(22) Filed: Mar. 9, 2023

(65) Prior Publication Data
    US 2024/0107736 A1    Mar. 28, 2024

Related U.S. Application Data

(60) Provisional application No. 63/410,039, filed on Sep. 26, 2022.

(51) Int. Cl.
| | |
|---|---|
| *H10B 10/00* | (2023.01) |
| *H10D 30/62* | (2025.01) |
| *H10D 30/67* | (2025.01) |
| *H10D 62/10* | (2025.01) |
| *H10D 84/01* | (2025.01) |

(Continued)

(52) U.S. Cl.
    CPC ....... *H10B 10/125* (2023.02); *H10D 30/6211* (2025.01); *H10D 30/6735* (2025.01); *H10D 62/121* (2025.01); *H10D 84/0188* (2025.01); *H10D 84/0193* (2025.01); *H10D 84/038* (2025.01); *H10D 84/853* (2025.01)

(58) Field of Classification Search
    CPC . H10D 84/0151; H10D 84/0158; H10D 89/10
    See application file for complete search history.

(56) References Cited

U.S. PATENT DOCUMENTS

| | | | |
|---|---|---|---|
| 11,315,933 B2 | 4/2022 | Wen et al. | |
| 11,374,104 B2 | 6/2022 | Chen et al. | |
| 2020/0006354 A1* | 1/2020 | Wen | H10D 84/038 |

(Continued)

FOREIGN PATENT DOCUMENTS

| | | |
|---|---|---|
| TW | 201507004 A | 2/2015 |
| TW | 201624619 A | 7/2016 |

*Primary Examiner* — Fernando L Toledo
*Assistant Examiner* — Adam S Bowen
(74) *Attorney, Agent, or Firm* — HAYNES AND BOONE, LLP

(57) ABSTRACT

An IC structure and a method of forming the same are provided. In an embodiment, an exemplary method of forming the IC structure includes forming a first semiconductor fin and a second semiconductor fin protruding from a substrate, forming a high-k metal gate (HKMG) structure over the first semiconductor fin and the second semiconductor fin, forming a trench to separate the HKMG structure into two portions, conformally depositing a first dielectric layer in the trench, depositing a second dielectric layer over the first dielectric layer to fill the trench, wherein the second dielectric layer includes nitrogen, and the first dielectric layer is free of nitrogen, and planarizing the first dielectric layer and second dielectric layer to form a gate isolation structure in the trench.

20 Claims, 14 Drawing Sheets

(51) Int. Cl.
  *H10D 84/03*       (2025.01)
  *H10D 84/85*       (2025.01)

(56) References Cited

U.S. PATENT DOCUMENTS

2021/0098594 A1\*  4/2021  Chen .................... H10D 84/834
2022/0052042 A1    2/2022  Lin et al.

\* cited by examiner

GATE ISOLATION STRUCTURES

PRIORITY

This application claims the priority of U.S. Provisional Application Ser. No. 63/410,039, filed Sep. 26, 2022, entitled "Gate Isolation Structures," the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, various methods have been developed to cut (or separate) metal gate structures in forming advanced ICs. While they have been generally adequate in providing isolation for metal gate structures, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1B:
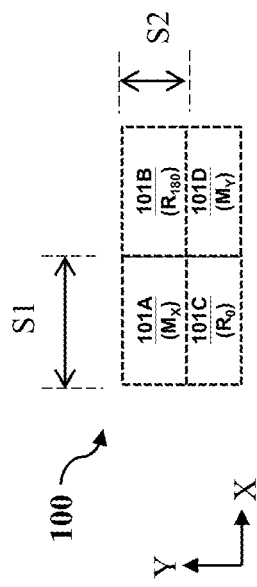
FIGS. 1B and 1C are diagrammatic plan views of an array of memory cells, such as static random-access memory (SRAM) cells, in portion or entirety, according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Multi-gate devices, such as fin field-effect transistors (FinFETs) and multi-bridge-channel (MBC) transistors, have been introduced in an effort to improve gate control by increasing gate-channel coupling, reduce OFF-state current, and reduce short-channel effects (SCEs). A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor. The three-dimensional structure of the multi-gate devices allows them to be aggressively scaled while maintaining gate control and mitigating SCEs.

Replacing polysilicon gates with high-k metal gate (HKMG) structures has brought about improvement in device performance as feature sizes continue to decrease. Generally, after a HKMG structure is formed in a three-dimensional field effect transistor (e.g., a fin-like field effect transistor, or FinFET, a gate-all-around FET, or GAA FET, etc.), a number of methods may be implemented independently or in combination to further process the HKMG structure according to specific design requirements. In one example, the HKMG structure may be cut into two or more portions and subsequently separated by gate isolation structure(s) in a process referred to as cut metal gate (CMG). The gate isolation structures are oriented lengthwise in a direction generally perpendicular to the direction of the HKMG structures.

While these methods have been generally adequate, they have not been entirely satisfactory in all aspects. For instance, to provide better isolation, the gate isolation structure may extend into a semiconductor substrate that has n-type doped region(s) (or n well(s)) and/or p-type doped region(s) (or p well(s)) and may be formed of high-k dielectric materials, which are dielectric materials having a dielectric constant greater than that of silicon oxide (k~3.9). In situations where the gate isolation structure is formed of materials having positive charge, such as silicon nitride (SiN), silicon oxycarbonitride (SiOCN), silicon oxynitride (SiON), the positive charge can induce negative charge in the n-type doped wells and/or p-type doped wells, leading to an increased leakage current. Thus, improvements in methods of processing HKMG structure with reduced leakage current are desired.

The present disclosure provides integrated circuit structures and methods for forming gate isolation structures in the integrated circuit structures. In an embodiment, the formation of a gate isolation structure includes forming a trench extending through the HKMG structure and an isolation feature disposed directly under the HKMG structure. The trench may also extend into the semiconductor substrate. After forming the trench, a first dielectric layer that is free of nitrogen is conformally deposited to partially fill the trench. That is, sidewall and bottom surfaces of the trench are lined by the first dielectric layer. After forming the first dielectric layer, a second dielectric layer may be formed over the first dielectric layer to fill a remaining portion of the trench. In an embodiment, the first dielectric layer is free of nitrogen and includes silicon oxide, the second dielectric layer includes nitrogen and is formed of silicon nitride. The first dielectric layer serves as a barrier for preventing positive charge of the second dielectric layer from inducing negative charge in the n-type doped wells and/or p-type doped wells formed in the semiconductor substrate. Therefore, leakage current of the integrated circuit structures may be advantageously reduced.

Figure 1C:
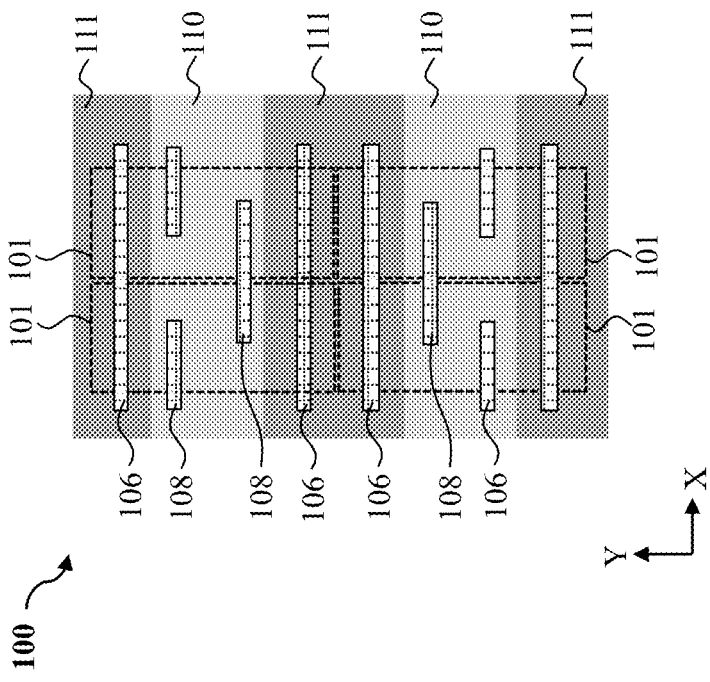
Figure 1A:
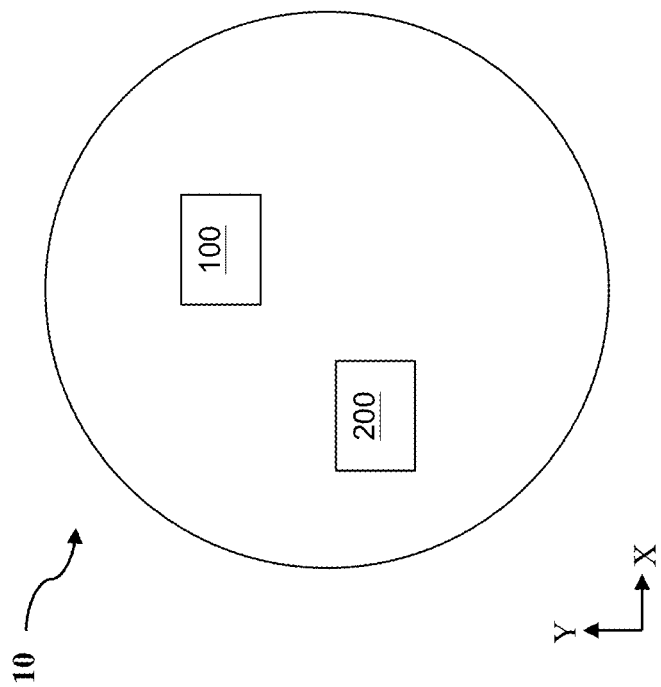
FIG. 1A is a diagrammatic plan view of an IC chip, in portion or entirety, according to various aspects of the present disclosure.
Figure 2:
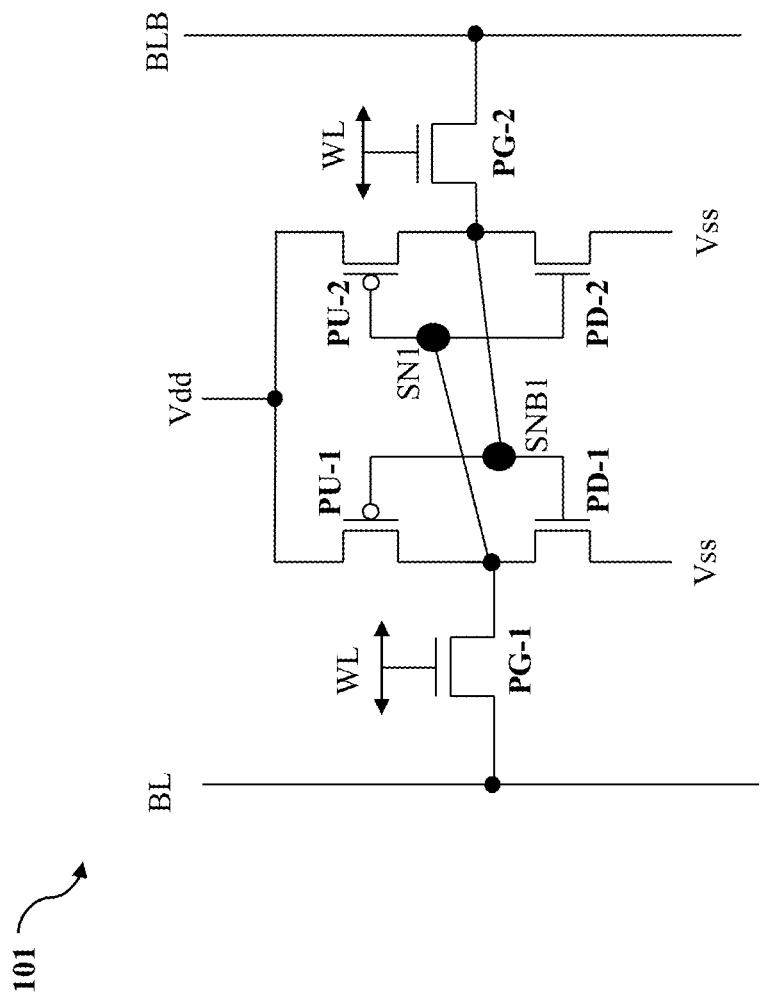
FIG. 2 is a circuit diagram of a memory cell, such as an SRAM cell, that can be implemented in the IC chip of FIG. 1, according to various aspects of the present disclosure.
Figure 3:
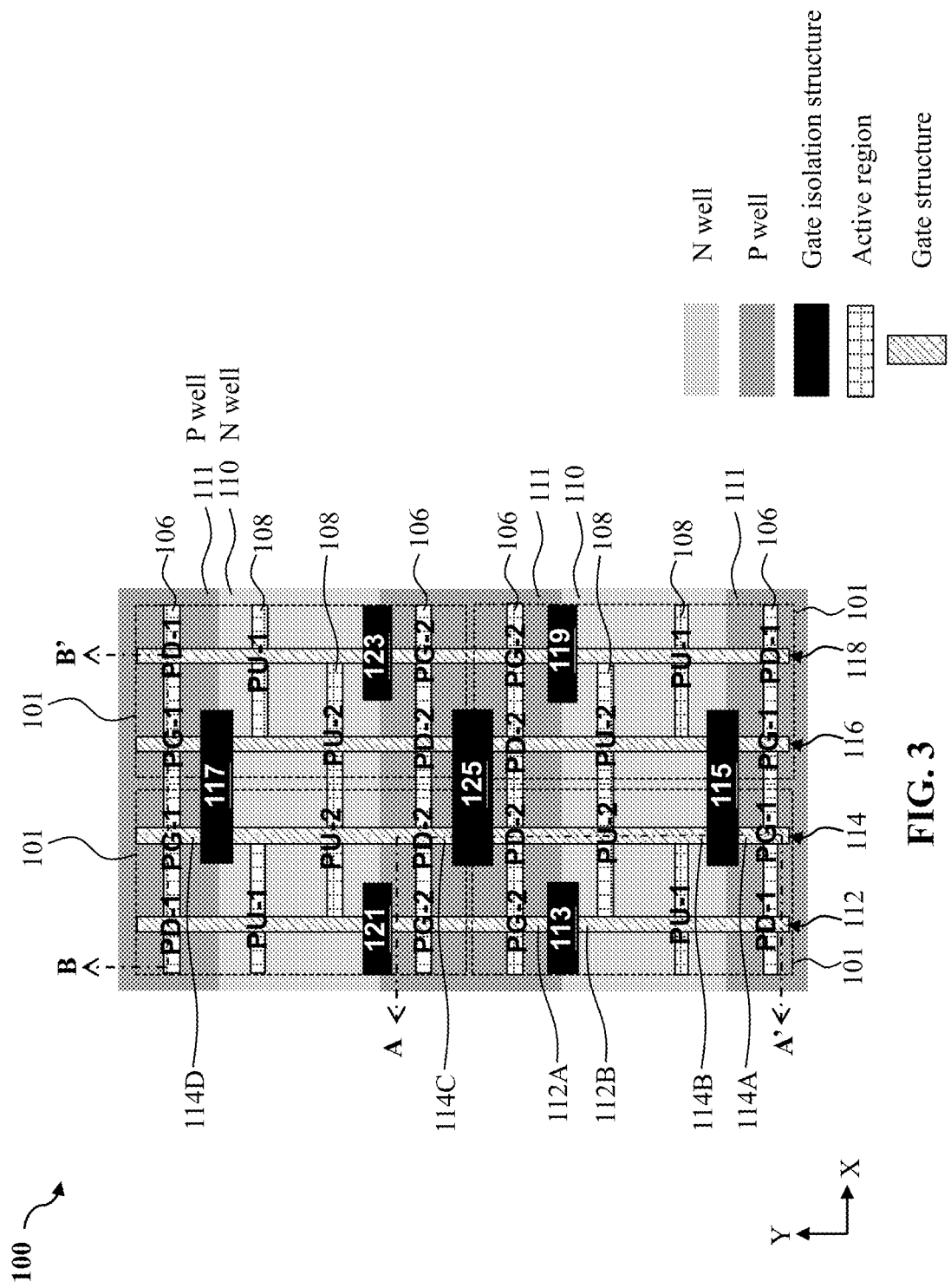
FIG. 3 is a fragmentary top, plan view of an array of memory cells that includes a number of gate isolation structures, according to various aspects of the present disclosure.
Figure 4:
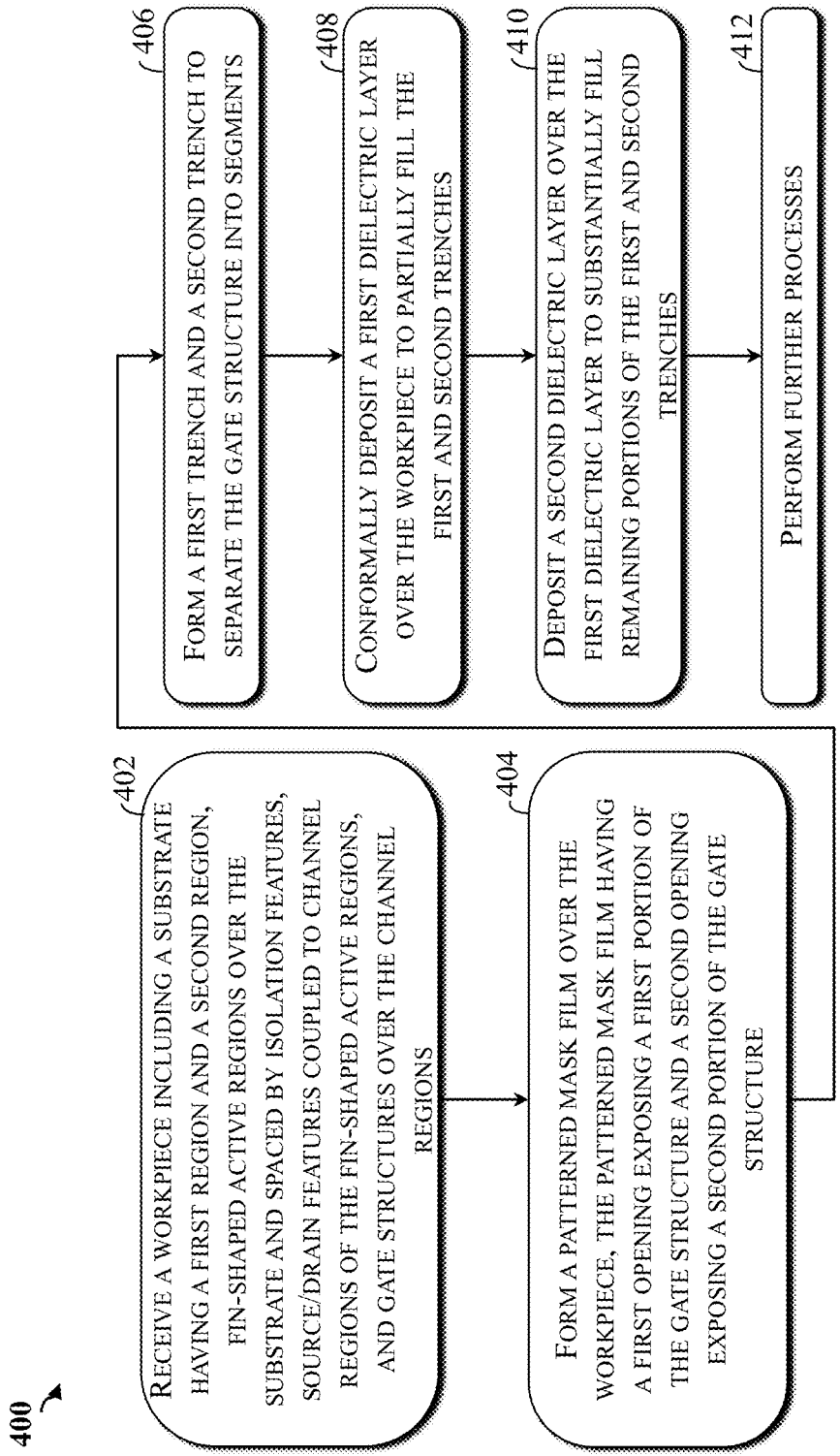
FIG. 4 illustrates a flowchart of an exemplary method for fabricating gate isolation structures of the array of memory cells, according to various embodiments of the present disclosure.

The various aspects of the present disclosure will now be described in more detail with reference to the figures. In that regard, FIG. 1A is a diagrammatic plan view of an exemplary IC chip. FIGS. 1B and 1C are diagrammatic plan views of an array of memory cells, such as static random-access memory (SRAM) cells, in portion or entirety, according to various aspects of the present disclosure. FIG. 2 is a circuit diagram of an SRAM cell that can be implemented in the IC chip of FIG. 1. FIG. 3 is a layout of an array of SRAM cells, in portion or entirety, according to various aspects of the present disclosure. FIG. 4 is a flow chart illustrating method 400 of forming gate isolation structures in the array of SRAM cells. Method 400 is described below in conjunction with FIGS. 5, 6, 7, 8, 9, 10, 11, 12 and FIGS. 13 and 14. Method 400 is merely an example and is not intended to limit the present disclosure to what is explicitly illustrated therein. Additional steps may be provided before, during, and/or after the method 400, and some steps described can be replaced, eliminated, or moved around for additional embodiments of the method. Not all steps are described herein in detail for reasons of simplicity. Because the workpiece 500/500' will be fabricated into an integrated circuit structure or SRAM array upon conclusion of the fabrication processes, the workpiece 500/500' may be referred to as the integrated circuit structure 500/500' or SRAM array 500/500' as the context requires. For avoidance of doubts, the X, Y and Z directions in FIGS. 3, 5, 6, 7, 8, 9, 10, 11, 12, 13, and 14 are perpendicular to one another and are used consistently throughout the present disclosure. Throughout the present disclosure, like reference numerals denote like features unless otherwise excepted.

Referring to FIG. 1A, the present disclosure provides an IC structure 10 formed over a semiconductor substrate and includes at least an array 100 of memory cells. The array 100 may include static random-access memory (SRAM) cells, dynamic random-access memory (DRAM) cells, non-volatile random-access memory (NVRAM) cells, flash memory cells, other suitable memory cells, or combinations thereof. The IC structure 10 may further include a number of other components, such as an array 200 of standard logic (STD) cells configured to provide various standard logic devices, such as inverter, AND, NAND, OR, XOR, NOR, other suitable devices, or combinations thereof. Additionally, the IC structure 10 may include various passive and active microelectronic devices, such as resistors, capacitors, inductors, diodes, bipolar transistors, high voltage transistors, high frequency transistors, other suitable devices, or combinations thereof. Additional features can be added to the IC structure 10 and some of the features described below can be replaced, modified, or eliminated in other embodiments of the IC structure 10.

In the present embodiments, referring to FIG. 1B, the array 100 includes a number of SRAM cells 101A, 101B, 101C, and 101D, which generally provide memory or storage capable of retaining data when power is applied. As such, the array 100 is hereafter referred to as a SRAM array 100. Each SRAM cell 101A-101D includes one or more transistors (e.g., FinFETs) to be described in detail below. The SRAM cells 101A, 101B, 101C, and 101D, together defining a two-by-two grid, exhibit mirror and/or rotational symmetry with respect to each other. For example, using the SRAM cell 101C as a reference (denoted "$R_0$"), a layout of the SRAM cell 101A (denoted "$M_X$") is a mirror image of a layout of the SRAM cell 101C with respect to the X direction. Similarly, a layout of the SRAM cell 101B is a mirror image of the layout of the SRAM cell 101A, and a layout of the SRAM cell 101D (denoted "$M_Y$") is a mirror image of the layout of the SRAM cell 101C, both with respect to the Y direction. In other words, the layout of the SRAM cell 101B (denoted "$R_{180}$") is symmetric to the layout of the SRAM 101C by a rotation of 180 degrees about a geometric center of the grid, which is defined as an intersection point of an imaginary line bisecting the rectangular grid along the Y direction and an imaginary line bisecting the rectangular grid along the X direction. Furthermore, in the depicted embodiments, the SRAM cells 101A-101D are substantially the same in size, i.e., having substantially the same horizontal pitch 51 along the X direction and a vertical pitch S2 along the Y direction. As such, each SRAM cells 101A-101D may hereafter be referred to as the SRAM cell 101 for purposes of simplicity.

Referring to FIG. 1C, each SRAM cell 101 is configured to include p-type three-dimensional fin-like active regions 106 (hereafter referred to as p-type fins 106) each disposed in a p-type doped region 111 (hereafter referred to as p well 111) and n-type three-dimensional fin-like active regions 108 (hereafter referred to as n-type fins 108) each disposed in a n-type doped region 110 (hereafter referred to as n well 110), which is interposed between two p wells 111. The p-type fins 106 and the n-type fins 108 are oriented lengthwise along X direction and spaced from each other along Y direction, which is substantially perpendicular to the X direction. In the present embodiments, the p-type fins 106 and the n-type fins 108 each may include a uniform semiconductor composition along the Z direction and a final structure of the SRAM array 100 includes FinFETs. In some embodiments, each of the p-type fins 106 and the n-type fins 108 may include a number of nanostructures (e.g., nanosheets) and a final structure of the SRAM array 100 includes GAA transistors. Various SRAM cells 101 may be configured for similar applications, such as a high-speed application, a low-power application, other suitable applications, or combinations thereof. Alternatively, different SRAM cells 101 may be configured for different applications and designed with different specifications (e.g., dimensions, layout designs, etc.) accordingly. Various aspects and embodiments of the SRAM cell 101 and the SRAM array 100 are described in detail below.

FIG. 2 illustrates an exemplary circuit schematic for a single-port SRAM cell (e.g., 1-bit SRAM cell) 101. The single-port SRAM cell 101 includes pull-up transistors PU-1, PU-2; pull-down transistors PD-1, PD-2; and pass-gate transistors PG-1, PG-2. As show in the circuit diagram, transistors PU-1 and PU-2 are p-type transistors, and transistors PG-1, PG-2, PD-1, and PD-2 are n-type transistors. Since the SRAM cell 101 includes six transistors in the illustrated embodiment, it may also be referred to as a 6T SRAM cell.

The drains of pull-up transistor PU-1 and pull-down transistor PD-1 are coupled together, and the drains of pull-up transistor PU-2 and pull-down transistor PD-2 are coupled together. Transistors PU-1 and PD-1 are cross-coupled with transistors PU-2 and PD-2 to form a first data latch. The gates of transistors PU-2 and PD-2 are coupled together and to the drains of transistors PU-1 and PD-1 to form a first storage node SN1, and the gates of transistors PU-1 and PD-1 are coupled together and to the drains of transistors PU-2 and PD-2 to form a complementary first storage node SNB1. Sources of the pull-up transistors PU-1 and PU-2 are coupled to a power voltage Vdd, and the sources of the pull-down transistors PD-1 and PD-2 are coupled to a voltage Vss, which may be an electrical ground in some embodiments. The first storage node SN1 of the first data latch is coupled to bit line BL through pass-gate transistor PG-1, and the complementary first storage node SNB1 is coupled to complementary bit line BLB through pass-gate transistor PG-2. The first storage node SN1 and the complementary first storage node SNB1 are complementary nodes that are often at opposite logic levels (logic high or logic low). Gates of pass-gate transistors PG-1 and PG-2 are coupled to a word line WL.

Figure 5:
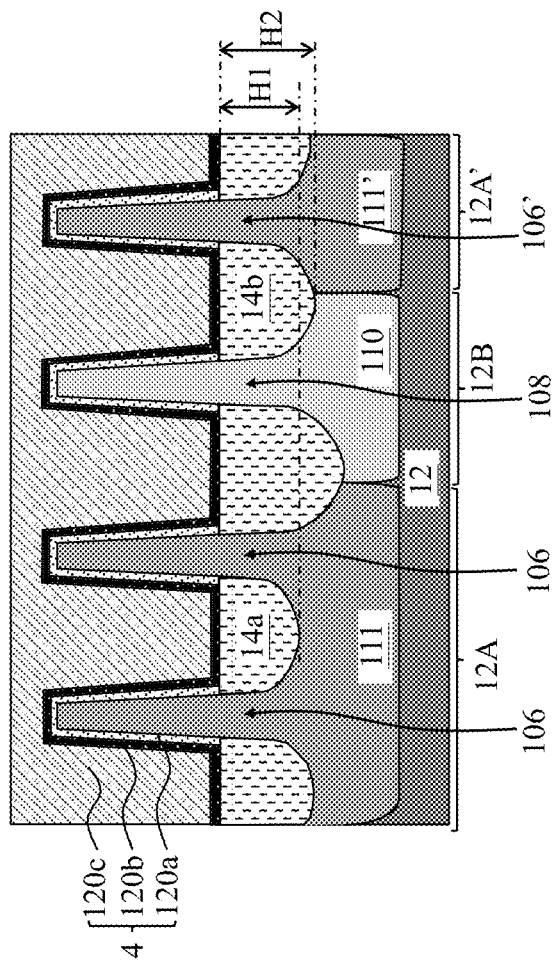
FIGS. 5, 7, 8, 10 and 11 illustrate fragmentary cross-sectional views of a workpiece taken along line A-A' as shown in FIG. 3 during various fabrication stages in the method of FIG. 4, according to various aspects of the present disclosure.
Figure 6:
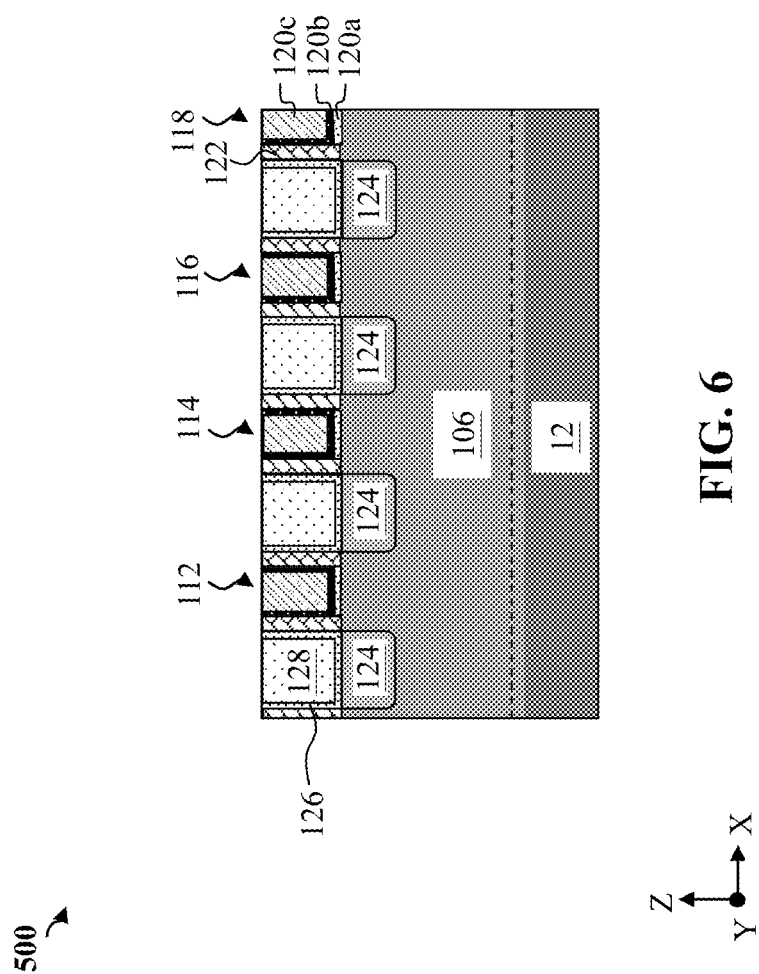
FIG. 6 illustrates a fragmentary cross-sectional view of the workpiece taken along line B-B' as shown in FIG. 3 during various fabrication stages in the method of FIG. 4, according to various aspects of the present disclosure.

FIG. 3 is a top, plan view of the SRAM array 100, in portion or entirety, according to various aspects of the present disclosure. Additional features can be added to the top, plan view of the SRAM array 100 and some of the features described below can be replaced, modified, or eliminated in other embodiments of the SRAM array 100. FIG. 5 illustrates a fragmentary cross-sectional view of the SRAM array 100 taken along line A-A as shown in FIG. 3. FIG. 6 illustrates a fragmentary cross-sectional view of the SRAM array 100 taken along line B-B as shown in FIG. 3.

In the present embodiments, referring to FIGS. 3, 5, and 6, the SRAM array 100/500 (as a portion of the IC structure 10) is formed over a substrate (or a wafer) 12 (shown in FIG. 5). The substrate 12 may be a bulk silicon substrate (i.e., including bulk single-crystalline silicon). The substrate 12 may include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof, or other suitable materials. In some alternative embodiments, the substrate 12 may be a semiconductor-on-insulator substrate, such as a silicon-on-insulator (SOI) substrate, a silicon germanium-on-insulator (SGOI) substrate, or a germanium-on-insulator (GOI) substrate. In an embodiment, the substrate 12 includes a first region 12A (shown in FIG. 5) for forming n-type field-effect transistor (NFETs) thereon and a second region 12B (shown in FIG. 5) for forming p-type field-effect transistors (PFETs) thereon. In an embodiment, the substrate 12 may be a hybrid substrate and the first region 12A and the second region 12B may have different compositions. For example, the first region 12A for forming n-type transistors may include silicon, the second region 12B for forming p-type transistors may include silicon germanium (SiGe).

The substrate 12 includes a number of p wells (p-type doped regions) 111 and n wells (n-type doped regions) 110 formed therein (and/or thereover) according to various design requirements of the SRAM array 100. In the depicted embodiments, the portion of the substrate 12 within each SRAM cell 101 includes an n well 110 disposed between two p wells 111. The n well 110 is configured to provide at least one p-type field-effect transistor (PFET), such as a pull-up transistor, and each p well 111 is configured to provide at least one n-type field-effect transistor (NFET), such as a pull-down transistor or a pass-gate transistor. In an embodiment, each p well 111 may be formed in the first region 12A, and each n well 110 may be formed in the second region 12B. In some embodiments, the substrate 12 may include additional doped regions configured to provide one or more transistors according to design requirements of the SRAM array 100.

In the present embodiments represented in FIG. 3, each SRAM cell 101 includes two p-type fins 106 each disposed in a p well 111 and two n-type fins 108 disposed in an n well 110 interposing between the two p wells 111. The p-type fins 106 and n-type fins 108 extend lengthwise along the X direction. In the present embodiments, a composition of the p-type fins 106 is different from a composition of the n-type fins 108. For example, the p-type fins 106 may include silicon (Si), and the n-type fins 108 may include silicon germanium (SiGe). The p-type fins 106 and n-type fins 108 may be formed from a top portion of the substrate 12 using a combination of lithography and etch steps. An exemplary lithography process includes spin-on coating a photoresist layer, soft baking of the photoresist layer, mask aligning, exposing, post-exposure baking, developing the photoresist layer, rinsing, and drying (e.g., hard baking). In some instances, the patterning of the p-type fins 106 and n-type fins 108 may be performed using double-patterning or multi-patterning processes to create patterns having pitches smaller than what is otherwise obtainable using a single, direct photolithography process. The etching process can include dry etching, wet etching, and/or other suitable processes. In an embodiment, the etching process etches the first region 12A and the second region 12B of the substrate 12 at different etch rates. More specifically, the first region 12A for forming the NFETs are etched slower than the second region 12B for forming the PFETs. That is, after the etching process, the height of the p-type fins 106 in the first region 12A are less than the height of the n-type fins 108 in the second region 12B. In other words, trenches that define the n-type fins 108 in the second region 12B are deeper than the trenches that define the p-type fins 106 in the first region 12A. For ease of description, in embodiments represented in FIG. 5, the first region 12A on the right side of the second region 12B may be referred to as the first region 12A', the p well 111 formed in the first region 12A' may be referred to as the p well 111', and the p-type fin 106 extending from the first region 12A' may be referred to as the p-type fin 106'.

The SRAM array 100 further includes isolation features (such as isolation features 14a, 14b shown in FIG. 5) disposed over the substrate 12 to electrically separate a fin-shaped active region (e.g., n-type fins 108, p-type fins 106/106') from an adjacent fin-shaped active region (e.g., n-type fins 108, p-type fins 106/106'). In some embodiments, the isolation features are deposited in trenches that define the n-type fins 108 and/or the p-type fins 106. In an exemplary process, a dielectric material for forming the isolation features is deposited over the substrate 12 using chemical vapor deposition (CVD), sub-atmospheric CVD (SACVD), flowable CVD (FCVD), physical vapor deposition (PVD), spin-on coating, and/or other suitable process. Then the deposited dielectric material is planarized and recessed until the n-type fins 108 and p-type fins 106/106' rise above the isolation features. The dielectric material for the isolation features may include silicon oxide, silicon oxynitride, fluorine-doped silicate glass (FSG), a low-k dielectric, combinations thereof, and/or other suitable materials. In the present embodiments, the isolation feature 14a formed between two adjacent p-type fins 106 has a height H1, the isolation feature 14b formed between and the n-type fin 108 and the p-type fin 106' has a height H2. Since trenches that define the n-type fins 108 are deeper than the trenches that define the p-type fins 106, the height H2 is greater than the height H1. The isolation features (e.g., isolation features 14a, 14b) may be shallow trench isolation (STI) features.

Still referring to FIGS. 3, 5 and 6, the SRAM array 100 also includes a number of gate structures, such as gate structures 112, 114, 116, 118, oriented lengthwise along the Y direction and engaging the p-type fins 106 and/or the n-type fins 108 to form various transistors. Each gate structure 112-118 traverses channel region(s) of p-type fin(s) 106 and/or n-type fin(s) 108. In the depicted embodiments, referring to FIG. 3 as an example, portions of the gate structure 114 engages a first p-type fin 106 to form a pass-gate transistor PG-1 and a second p-type fin 106 to form a pull-down transistor PD-2 in the upper left SRAM cell 101, and further engages a third p-type fin 106 to form a pull-down transistor PD-2 and a fourth p-type fin 106 to form a pass-gate transistor PG-1 in the lower left SRAM cell 101. Portions of the gate structure 114 also engages a first n-type fin 108 to form a pull-up transistor PU-2 in the upper left SRAM cell 101 and a second n-type fin 108 to form a pull-up transistor PU-2 in the lower left SRAM cell 101. Similarly, portions of the gate structures 112, 116, 118 also engage the p-type fins 106 and n-type fins 108 to form various transistors PU-1, PU-2, PD-1, PD-2, PG-1 and PG-2 in the SRAM array 100. In some embodiments, the pull-up transistor PU-1 and the PU-2 are configured as p-type transistors, while the pull-down transistor PD-1, PD-2, and the pass-gate transistors PG-1, PG-2 are configured as n-type transistors.

In embodiments represented in FIG. 3, for each SRAM cell 101, each gate structure is separated or cut into two electrically and physically isolated segments. For example, in the lower left SRAM cell 101 in the SRAM array 100, the gate structure 112 is cut by a gate isolation structure 113 into two segments 112A and 112B such that a gate electrode of the pass-gate transistor PG-2 is electrically isolated from gate electrodes of the pull-up transistor PU-1 and pull-down transistor PD-1. As depicted in FIG. 3, the gate isolation structure 113 is disposed over both then well 110 and the p well 111. Similarly, in the lower left SRAM cell 101 in the SRAM array 100, the gate structure 114 is cut by a gate isolation structure 115 into two segments 114A and 114B such that gate electrode of the pass-gate transistor PG-1 is electrically isolated from gate electrodes of the pull-up transistor PU-2 and pull-down transistor PD-2. As depicted in FIG. 3, the gate isolation structure 115 is also disposed over both the n well 110 and the p well 111. Similarly, the upper left SRAM cell 101 includes a gate isolation structure 121 and a gate isolation structure 117, the upper right SRAM cell 101 includes a gate isolation structure 123 and the gate isolation structure 117, and the lower right SRAM cell 101 includes a gate isolation structure 119 and the gate isolation structure 115. The gate isolation structures 113, 115, 117, 119, 121, 123 are used to isolate gate electrodes between a pass-gate transistor (i.e., PG-1, PG-2) and a pull-up transistor (i.e., PU-2, PU-1) and thus may be referred to as a first type gate isolation structure 113/115/117/119/121/123.

Still referring to FIG. 3, besides the first type gate isolation structures 113, 115, 117, 119, 121, 123, the SRAM array 100 also includes a second type gate isolation structure (e.g., a second type gate isolation structure 125) that is configured to provide gate isolation between two adjacent SRAM cells 101. For example, the gate structure 114 is further cut by the second type gate isolation structure 125 to isolate gate electrode of the pull-down transistor PD-2 in the lower left SRAM cell 101 from gate electrode of the pull-down transistor PD-2 in the upper left SRAM cell 101. That is, the second type gate isolation structure 125 is used to separate gate electrodes of two pull-down transistors (e.g., PD-2) from adjacent SRAM cells. In the present embodiments, an entirety of the second type gate isolation structure 125 is disposed directly over the p well 111. In embodiments represented in FIG. 3, the second type gate isolation structure 125 further separates gate electrodes of two pull-down transistors from the upper right SRAM cell 101 and the lower right SRAM cell 101. Although not shown, another second type gate isolation structure may be used to separate gate electrodes of two pull-down transistors PD-1 from adjacent SRAM cells. Each of the gate isolation structures 113, 115, 117, 119, 121, 123, 125 extends lengthwise along the X direction. As depicted in FIG. 3, the gate structure 114 is cut by the first type gate isolation structures 115, 117 and the second type gate isolation structure 125 into four segments 114A, 114B, 114C, and 114D. By forming the first type gate isolation structures and the second type gate isolation structures, the SRAM array 100 and its SRAM cells 101 may work properly to fulfill desired functions.

Method for forming the first type gate isolation structures and the second type gate isolation structures is described with reference to FIGS. 4-11. FIG. 4 illustrates a flowchart of an exemplary method for fabricating the gate isolation structures (e.g., the gate isolation structure 115 and 125) in the SRAM array 100, according to various embodiments of the present disclosure. FIGS. 5, 7-8, and 10-11 depict cross-sectional views of the SRAM array 100 taken along line A-A' as shown in FIG. 3 during various fabrication stages in the method of FIG. 4, FIG. 6 depicts a cross-sectional view of the SRAM array 100 taken along line B-B' as shown in FIG. 3, and FIG. 9 depicts a top, plan view of the SRAM array 100 of FIG. 8, in portion or entirety, according to various aspects of the present disclosure.

Referring now to FIGS. 4, 5, and 6, method 400 includes a block 402 where a workpiece 500 is received. The workpiece 500 includes the substrate 12. The substrate 12 has the first region(s) 12A for forming NFETs (such as pull-down transistors PD-1, PD-2 and pass-gate transistors PG-1, PG-2) thereon and the second region(s) 12B for forming PFETs (such as pull-up transistors PU-1, PU-2) thereon. The first region 12A may include silicon, the second region 12B may include silicon germanium (SiGe). The substrate 12 includes a number of p wells 111 formed in the first region(s) 12A and n wells 110 formed in the second region(s) 12B. Each n well 110 may be doped with an n-type dopant, such as nitrogen, phosphorus, arsenic, other n-type dopants, or combinations thereof. Each p well 111 may be doped with a p-type dopant, such as boron, indium, other p-type dopants, or combinations thereof. In some embodiments, the substrate 12 includes doped regions formed with a combination of p-type dopants and n-type dopants. The various doped regions can be formed directly on and/or in the substrate 12, for example, providing a p well structure, an n well structure, a dual-well structure, a raised structure, or combinations thereof. Each of the various doped regions may be formed by performing an ion implantation process, a diffusion process, other suitable doping processes, or combinations thereof. In the present embodiment represented in FIG. 5, the second region 12B is disposed between two first regions 12A. For ease of description, the first region 12A on the left side of the second region 12B may be referred to as the first region 12A, and the first region 12A on the right side of the second region 12B may be referred to as the first region 12A', and the p well 111 formed in the first region 12A' may be referred to as the p well 111'.

In embodiments represented in FIG. 5, the workpiece 500 includes two p-type fins 106 extending from the first region 12A, one n-type fin 108 extending from the second region 12B of the substrate, and one p-type fin 106 extending from the first region 12A'. For ease of description, the p-type fin 106 extending from the first region 12A' may be referred to as the p-type fin 106'. As described above, the p-type fin(s) 106/106' and n-type fin(s) 108 may be formed by etching back the first region(s) 12A/12A' and the second region(s) 12B of the substrate 12. The p-type fin 106/106' may include Si, and the n-type fin 108 may include SiGe. As described above, the height of the p-type fins 106/106' is less than the height of the n-type fin 108.

The workpiece 500 also includes a number of isolation features (e.g., isolation features 14a and 14b) configured to isolate two adjacent fins. For example, the isolation feature 14a is disposed between the two p-type fins 106 extending from the first region 12A, and the isolation feature 14b is disposed between the n-type fin 108 and the p-type fin 106'. As described above, the isolation feature 14a has a height H1 less than the height H2 of the isolation feature 14b and a bottommost portion of the isolation feature 14b is below a bottommost portion of the isolation feature 14a.

Still referring to FIGS. 3, 5 and 6, the workpiece 500 also includes gate structures (e.g., gate structures 112, 114, 116, 118) disposed over channel regions of the n-type fins 108 and/or p-type fins 106/106'. In the cross-sectional view of the workpiece 500 represented in FIG. 5, the gate structure 114 wraps over channel regions of the two p-type fins 106, the n-type fin 108, and the p-type fin 106'. Each of the gate structures 112, 114, 116 and 118 includes a gate dielectric layer and a gate electrode 120c over the gate dielectric layer. The gate dielectric layer includes an interfacial layer 120a and a high-k dielectric layer 120b. In some instances, the interfacial layer 120a may be formed by thermal oxidation and may include silicon oxide. The high-k dielectric layer 120b is formed of dielectric materials having a high dielectric constant, for example, greater than a dielectric constant of silicon oxide (k≈3.9). Exemplary dielectric materials for the high-k dielectric layer include hafnium oxide, titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), silicon nitride (SiN), silicon oxynitride (SiON), combinations thereof, or other suitable materials. In one embodiment, the high-k dielectric layer 120b is formed of hafnium oxide. The gate electrode 120c may include multiple layers, such as work function layers, glue/barrier layers, and/or metal fill (or bulk) layers. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as aluminum (Al), copper (Cu), tungsten (W), ruthenium (Ru), titanium (Ti), a suitable metal, or a combination thereof. Sidewalls of the gate structures 112, 114, 116 and 118 are lined with gate spacers 122 (shown in FIG. 6). In some embodiments, the gate spacers 122 may include silicon carbonitride, silicon oxycarbide, silicon oxycarbonitride, or silicon nitride.

The workpiece 500 also includes n-type source/drain features 124 (shown in FIG. 6) formed in the p well 111 and coupled to the channel regions of the p-type fins 106/106'. Source/drain feature(s) may refer to a source or a drain, individually or collectively dependent upon the context. Exemplary n-type source/drain features 124 may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Although not shown, the workpiece 500 also includes p-type source/drain features formed in the n well 110 and coupled to the channel regions of the n-type fins 108. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process. In some embodiments, the n-type source/drain features 124 and/or the p-type source/drain features each may be a multi-layer structure that includes an undoped semiconductor layer, a lightly doped semiconductor layer, and a heavily doped semiconductor layer.

Still referring to FIGS. 5 and 6, the workpiece 500 also includes a contact etch stop layer (CESL) 126 and an interlayer dielectric (ILD) layer 128 deposited over the n-type source/drain features 124. The CESL 126 may include silicon nitride, silicon oxynitride, and/or other materials known in the art and may be formed by atomic layer deposition (ALD), plasma-enhanced chemical vapor deposition (PECVD) process and/or other suitable deposition or oxidation processes. As shown in FIG. 6, the CESL 126 may be deposited on top surfaces of the n-type source/drain features 124 and sidewalls of the gate spacers 122. The ILD layer 128 may be deposited by a PECVD process or other suitable deposition technique after the deposition of the CESL 126. The ILD layer 128 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

In some embodiments, a gate replacement process (or gate-last process) may be adopted where some dummy gate stacks (not shown) serve as placeholders for those functional gate structures 112, 114, 116 and 118. In an example gate last process, dummy gate stacks (not shown) are formed over channel regions of the n-type fins 108 and p-type fins 106. Each dummy gate stacks may include a gate dielectric layer (e.g., $SiO_2$) and a dummy gate electrode layer (e.g., polysilicon) formed thereon. The gate spacers 122 are then deposited over the workpiece 500, including over sidewalls of the dummy gate stacks. Source/drain features may be formed after the forming of the dummy gate stacks. After forming the CESL 126 and the ILD layer 128, a planarization process, such as a CMP process, may be performed to remove excess materials to expose the dummy gate stacks. The dummy gate stacks are then removed and replaced with the gate structures 112, 114, 116 and 118, the composition of which has been described above.

Figure 7:
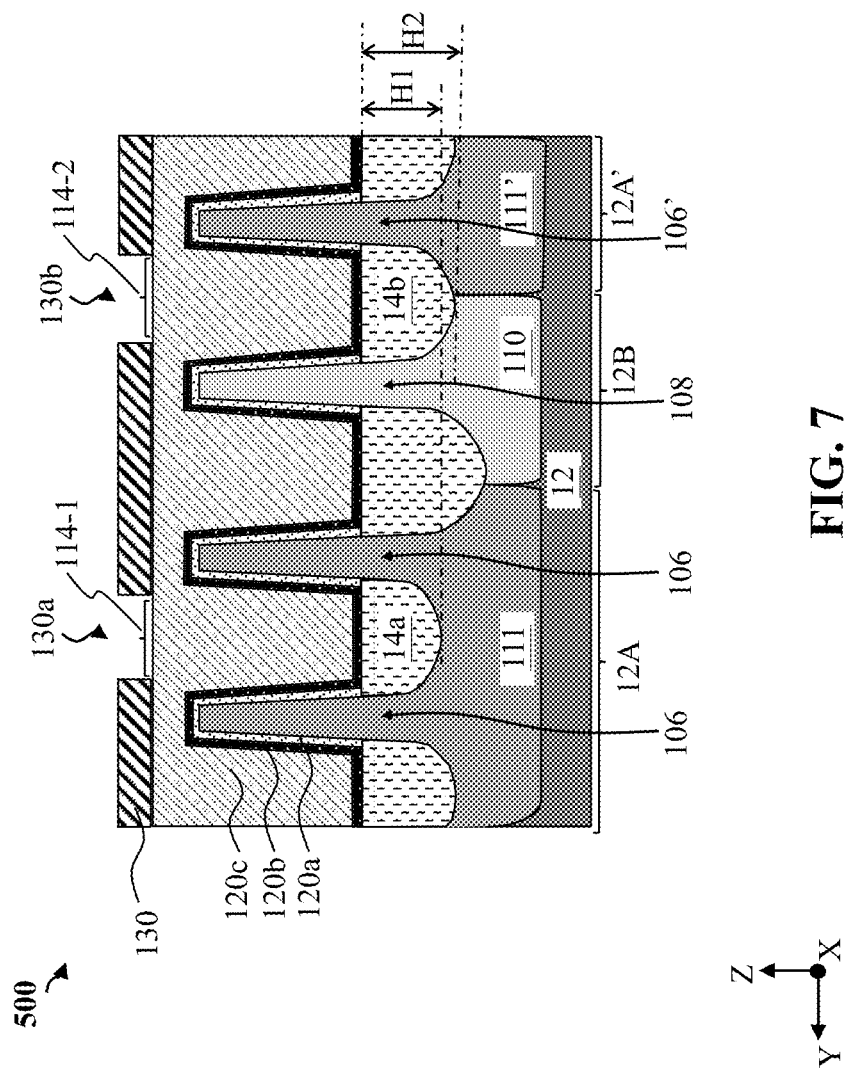

Referring to FIGS. 4 and 7, method 400 includes a block 404 where a patterned mask film 130 is formed over the workpiece 500. In some embodiments, a mask film 130 may include aluminum oxide, silicon oxide, silicon nitride, silicon carbonitride, silicon oxycarbide, silicon oxynitride, silicon oxycarbonitride, other suitable materials, or combinations thereof, and may be formed by CVD, ALD, PVD, other suitable methods, or combinations thereof. In an embodiment, the mask film 130 is formed of silicon nitride. The mask film 130 is patterned to form a first opening 130a and a second opening 130b. The patterning of the mask film 130 may include multiple processes. For example, a masking element including a photoresist layer may be formed over the mask film 130, exposed to a radiation source through a patterned mask, and subsequently developed to form a patterned masking element. The mask film 130 may then be etched using the patterned masking element as an etch mask to form the first opening 130a exposing a first portion 114-1 of the gate structure 114 and the second opening 130b exposing a second portion 114-2 of the gate structure 114. The patterned masking element may be removed after forming the first opening 130a and the second opening 130b. In the cross-sectional view represented in FIG. 7, the first portion 114-1 of the gate structure 114 is disposed between the two adjacent p-type fins 106 over the p well 111 and over the STI feature 14a, the second portion 114-2 of the gate structure 114 is disposed between the n-type fin 108 and the p-type fin 106' and over the STI feature 14b. Although not shown in FIG. 7, as indicated by the top, planar view of the SRAM array 100, the patterned mask film 130 also includes other openings configured to expose other portions of the gate structures 112, 114, 116, and 118 to facilitate the formation of gate isolation structures (e.g., the gate isolation structures 113, 117, 119, 121, 123) in the SRAM array 100.

Figure 8:
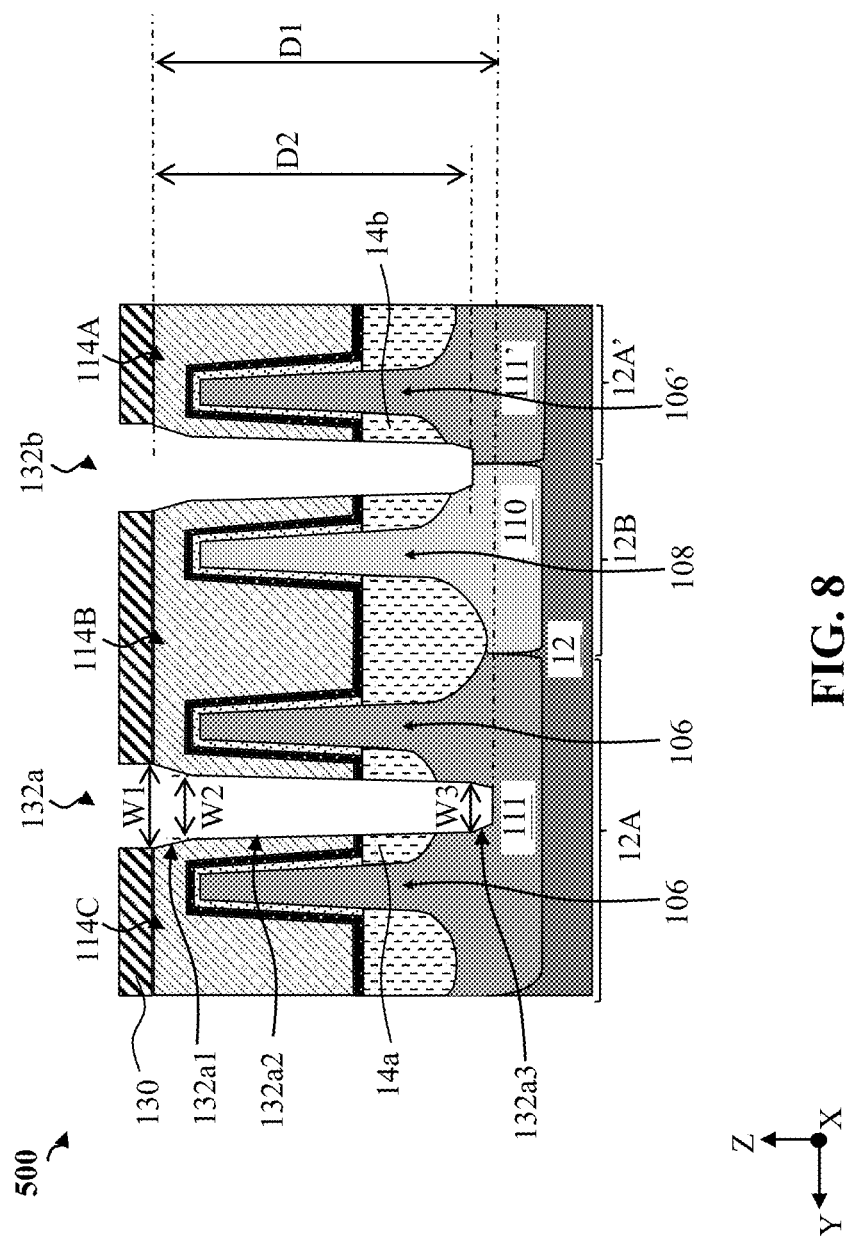
Figure 9:
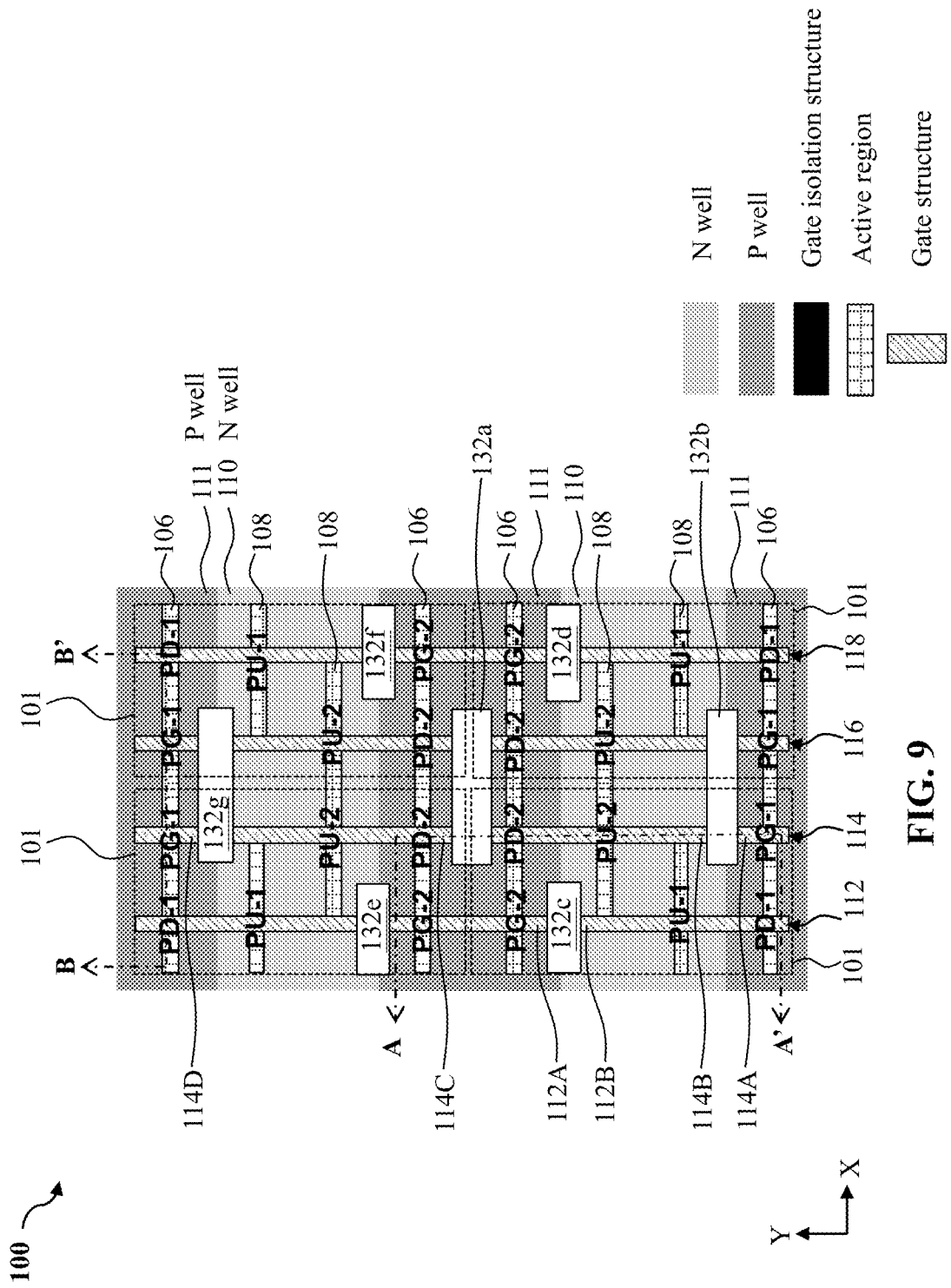
FIG. 9 is a fragmentary top, plan view of the workpiece shown in FIG. 8, according to various aspects of the present disclosure.

Referring to FIGS. 4, 8 and 9, method 400 includes a block 406 where a first trench 132a and a second trench 132b are formed to separate the gate structure 114. While using the patterned mask film 130 as an etch mask, an etching process is performed to the workpiece 500 to form the first trench 132a and the second trench 132b. In some implementations, the etching process may be a dry etching process. An exemplary dry etching process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In embodiments represented in FIG. 8, the first trench 132a extends through the gate structure 114 and the STI feature 14a and extends into the p well 111, and is disposed between the two p-type fins 106. The second trench 132b extends through the gate structure 114 and the STI feature 14b and extends into both then well 110 and the p well 111', and is disposed between the n-type fin 108 and the p-type fin 106'. In the present embodiments, since the height H1 of the STI feature 14a is less than the height H2 of the STI feature 14b, and the etching process may etch the STI features at a slower rate than it etches the substrate 12, after the etching process, a depth D1 of the first trench 132a is greater than a depth D2 of the second trench 132b. The patterned mask film 130 may be selectively removed after the formation of the first trench 132a and the second trench 132b.

In the present embodiments, the first trench 132a has an upper portion 132a1, a middle portion 132a2, and a lower portion 132a3. The upper portion 132a1 spreads a width W1 along the Y direction, the middle portion 132a2 spreads a width W2 along the Y direction, and the lower portion 132a3 spreads a width W3 along the Y direction, where W1 is greater than W2, and W2 is greater than W3. A profile of the cross-sectional view of the second trench 132b is similar to that of the first trench 132a, and the second trench 132b also has a wider upper portion, a middle portion, and a narrower lower portion. In the cross-sectional view represented in FIG. 8, the first trench 132a and the second trench 132b separate the gate structure 114 into the three segments 114C, 114B, and 114A. FIG. 9 depicts a planar, top view of the SRAM array 500 shown in FIG. 8 after the removal of the patterned mask film 130. As indicated in FIG. 9, the first trench 132a extends lengthwise along the X direction, and not only separates the gate structure 114, but also separates the gate structure 116. The second trench 132b extends lengthwise along the X direction, and not only separates the gate structure 114, but also separates the gate structure 116. The SRAM array 500 also includes trenches such as trenches 132c, 132d, 132e, 132f, 132g configured to separate the gate structures 112, 114, 116, and/or 118 into segments to facilitate the formation of the gate isolation structures, thereby providing a final SRAM array with satisfactory functions.

Figure 10:
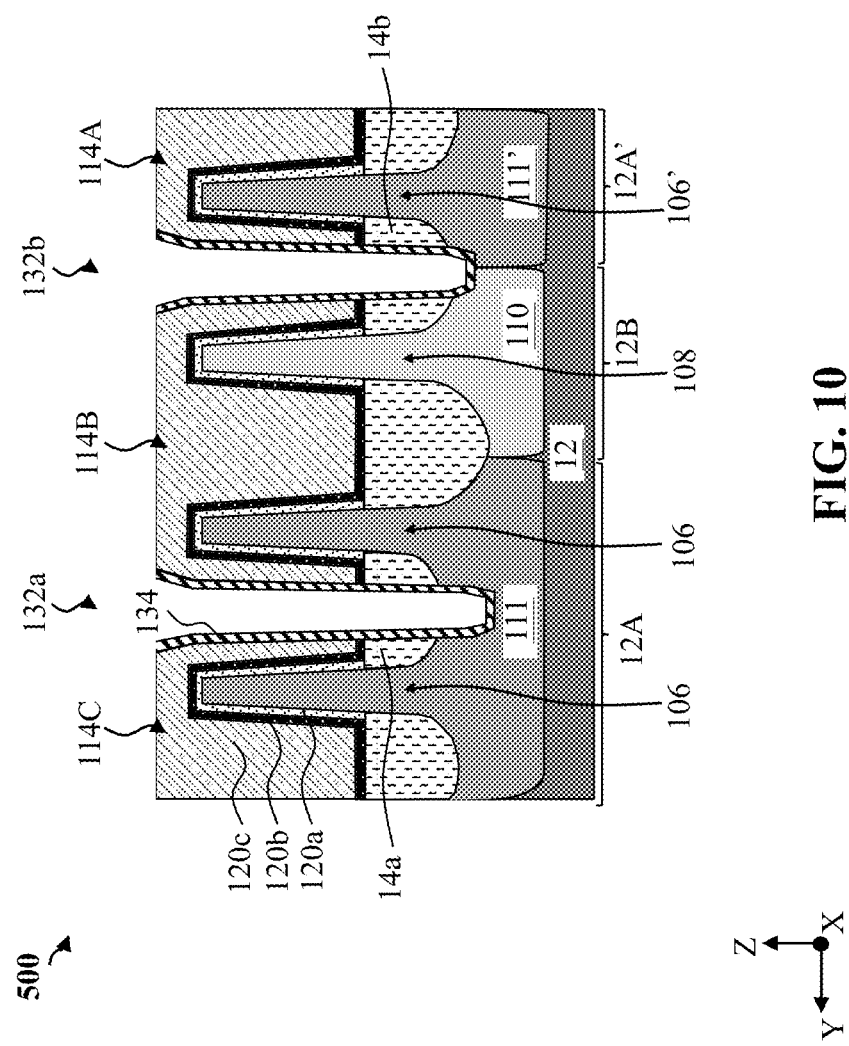

Referring to FIGS. 4 and 10, method 400 includes a block 408 where a first dielectric layer 134 is conformally deposited over the workpiece 500 to partially fill the first trench 132a and the second trench 132b. In the present embodiments, to substantially eliminate or reduce latch-up caused by gate isolation structures in the SRAM array 100, the first dielectric layer 134 includes one or more dielectric materials and is free of nitrogen. For example, the first dielectric layer 134 may include silicon oxide, low-k dielectric material, or a combination thereof. The low-k dielectric material may include porous silicon oxide, doped silicon oxide (e.g., SiOC, BPSG, FSG, PSG, BSG, etc.), other low-k dielectric materials, or combinations thereof, and may be formed by any suitable method including CVD, ALD. The first dielectric layer 134 serves as a barrier for preventing positive charge of a second dielectric layer (i.e., the second dielectric layer 136 shown in FIG. 11) from inducing negative charge in the p well 111, the n well 110, and the p well 111'. In an embodiment, the first dielectric layer 134 includes silicon oxide and is formed by ALD.

In an embodiment, a deposition thickness of the first dielectric layer 134 is greater than 1 nm. For example, the deposition thickness of the first dielectric layer 134 may be between about 2 nm and about 3 nm. After the deposition of the first dielectric layer 134, a planarization process (e.g., one or more chemical mechanical polishing) may be performed to remove excess portions of the first dielectric layer 134 until a top surface of the gate electrode 120c is exposed.

Figure 11:
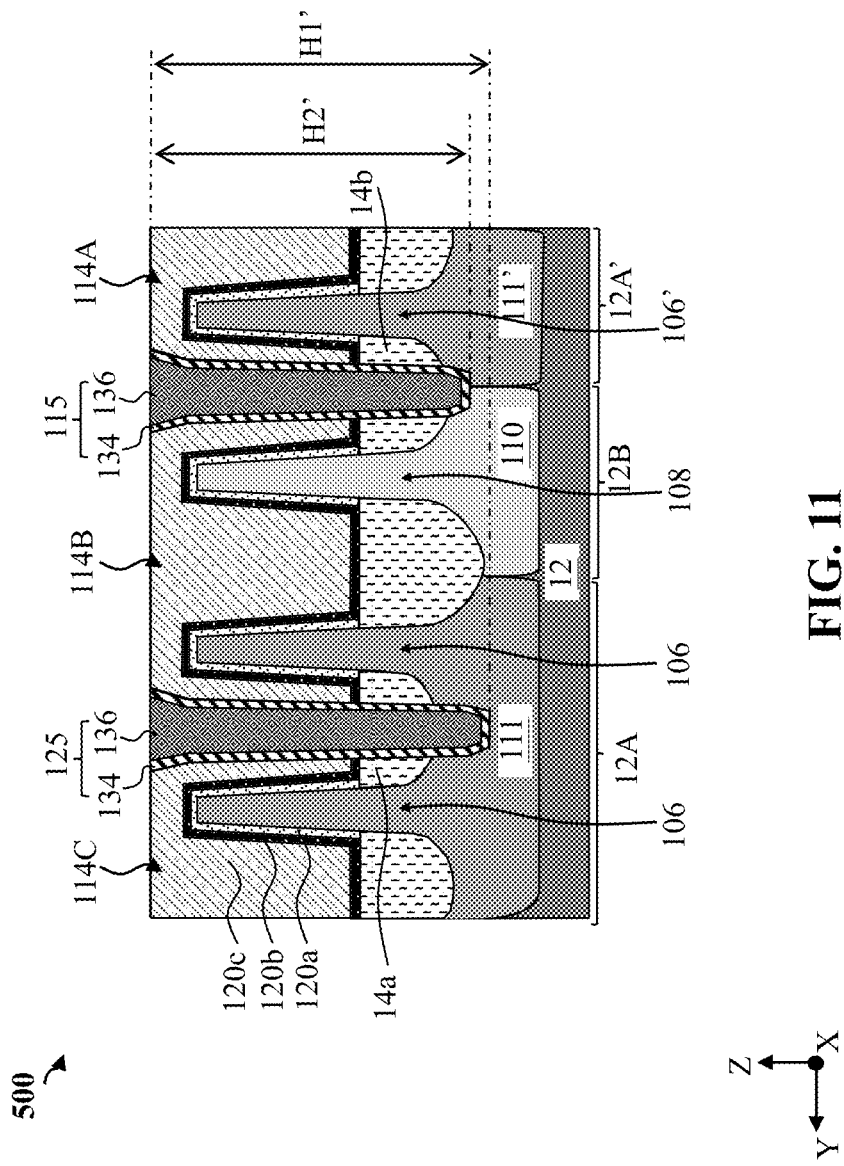
Figure 12:
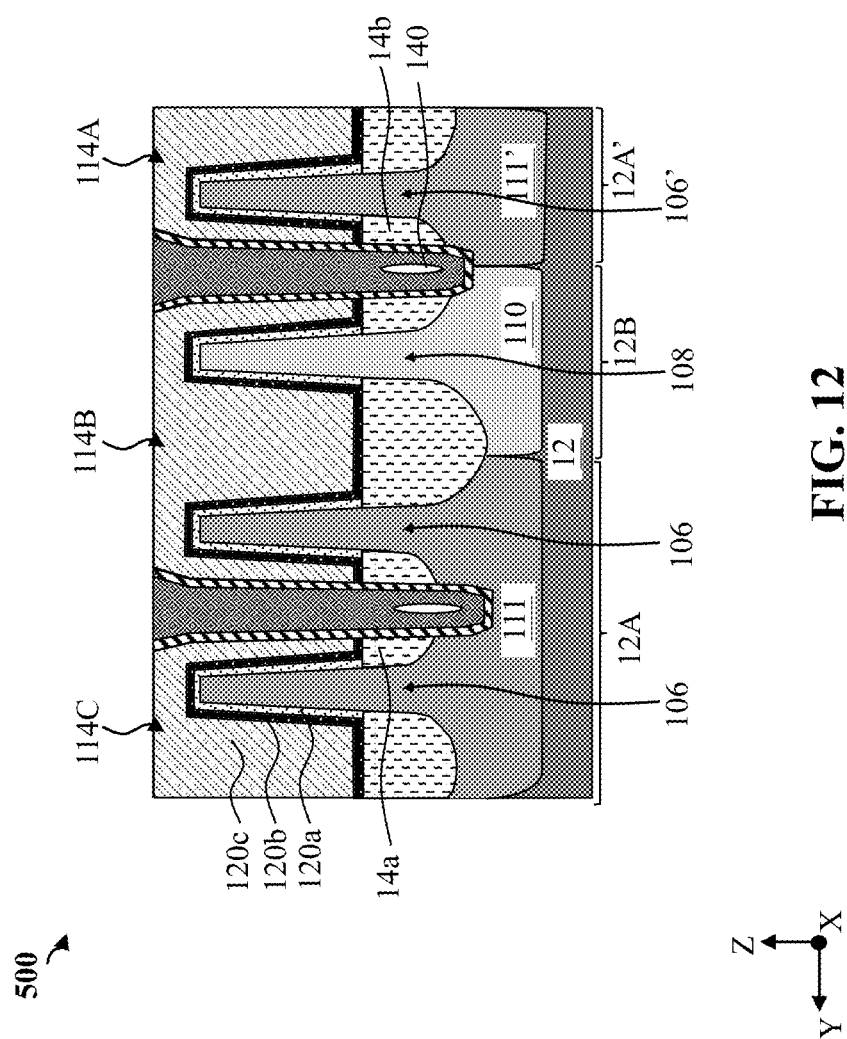
FIG. 12 illustrates a fragmentary cross-sectional view of an alternative workpiece taken along line A-A' as shown in FIG. 3, according to various aspects of the present disclosure.

Referring to FIGS. 4 and 11 and 12, method 400 includes a block 410 where a second dielectric layer 136 is conformally deposited over the first dielectric layer 134 to substantially fill remaining portions of the first trench 132a and the second trench 132b. In an embodiment, a deposition thickness of the second dielectric layer 136 is greater than 15 nm. The second dielectric layer 136 may be deposited by CVD, ALD, other suitable methods, or combinations thereof. Notably, the composition of the second dielectric layer 136 is distinctly different from that of the first dielectric layer 134 in that the first dielectric layer 134 is free of nitrogen. In some embodiments, the second dielectric layer 136 is formed of one or more dielectric materials having positive charge, such as a nitrogen-containing dielectric material (e.g., silicon nitride (SiN), silicon oxycarbonitride (SiOCN), silicon oxynitride (SiON)). In such embodiments, even if the second dielectric layer 136 is formed of a nitrogen-containing dielectric material and includes positive charge, the positive charge are blocked by the first dielectric layer 134. Therefore, latch-up in the SRAM array 100 may be substantially eliminated or reduced. Thus, SRAM arrays that include gate isolation structures having a dielectric liner formed of a nitrogen-free material may have a reduced leakage current. In some embodiments, a dielectric constant of the first dielectric layer 134 is less than dielectric constant of the second dielectric layer 136. In an embodiment, the first dielectric layer 134 includes silicon oxide and is formed by ALD, the second dielectric layer 136 includes silicon nitride and is formed by ALD. In some other embodiments, the second dielectric layer 136 may include a high-k dielectric material (having a dielectric constant of greater than that of silicon oxide) such as hafnium oxide, zirconium oxide, titanium oxide.

The forming of the first dielectric layer 134 and the second dielectric layer 136 forms the gate isolation structure 125 in the first trench 132a and the gate isolation structure 115 in the second trench 132b. More specially, each of the gate isolation structure 125 and the gate isolation structure 115 includes the first dielectric layer 134 and the second dielectric layer 136 embedded in the first dielectric layer 134. Sidewall and bottom surfaces of the second dielectric layer 136 are lined by the first dielectric layer 134. The gate isolation structure 125 tracks the shape of the first trench 132a, and the gate isolation structure 115 tracks the shape of the second trench 132b. That is, the gate isolation structure 125 and the gate isolation structure 115 each has a wider upper portion, a middle portion, and a narrower lower portion. In the present embodiments, the gate isolation structure 125 extends through the gate structure 114 and the STI feature 14a, and extends into the p well 111. The gate isolation structure 115 extends through the gate structure 114 and the STI feature 14b, and extends into the n well 110 and p well 111'.

In embodiments represented in FIG. 12, during the deposition of the second dielectric layer 136, one or more air gaps 140 may be formed in the first trench 132a and/or the second trench 132b. In some embodiments, formation of metal contacts over source/drain features may involve recessing the gate isolation structures. To prevent metal contact from being deposited into the air gaps to cause potential short issue, the deposition process for forming the second dielectric layer 136 may be controlled such that the air gap 140 is lower than a top surface of the isolation feature 14a/14b.

After the deposition of the second dielectric layer 136, a planarization process (e.g., one or more chemical mechanical polishing (CMP) processes) may be performed to the workpiece 500 to provide a planar top surface. The planarization process further defines final structures of the gate isolation structure 125 and the gate isolation structure 115. After the planarization process, a top surface of the second dielectric layer 136 is coplanar with a top surface of the first dielectric layer 134 and a top surface of the gate structure 114. In the present embodiments, after the planarization process, the gate isolation structure 125 has a height H1' along the Z direction, the gate isolation structure 115 has a height H2' along the Z direction, and the height H1' is greater than the height H2'.

Referring to FIG. 4, method 400 includes a block 412 where further processes are performed. Such further processes may include forming device-level contacts, such as gate contacts (not depicted) formed over the segments of gate structures, source/drain contacts formed over source/drain features, butted contacts. Such further processes may also include forming a multi-layer interconnect (MLI) structure (not depicted) over the workpiece 500. The MLI may include various interconnect features, such as vias and conductive lines, disposed in dielectric layers, such as etch-stop layers and ILD layers. In some embodiments, the vias are vertical interconnect features configured to interconnect device-level contacts.

In the above embodiments, the SRAM array 100 is a high-density SRAM array. In some other implementations, the SRAM array may be fabricated to be a high-current SRAM array. The high-current SRAM array may be similar to the high-density SRAM array 100 except for the disclosure of n-type dual-fin devices in the high-current SRAM array. In embodiments represented in FIG. 13, a SRAM array 500' includes dual-fin or double-fin n-type devices formed over the p wells 111 and mono-fin or single-fin devices formed over the n wells 110. That is, each of the pull-down transistors PD-1, PD-2 and pass-gate transistors PG-1, PG-2 is a dual-fin device, and each of the pull-up transistors PU-1, PU-2 is a mono-fin device. The method 400 for forming gate isolation structures may be applied to the high-current SRAM arrays. For example, the SRAM array 500' also includes gate isolation structures 113, 115, 117, 119, 121, 123, 125.

Figure 13:
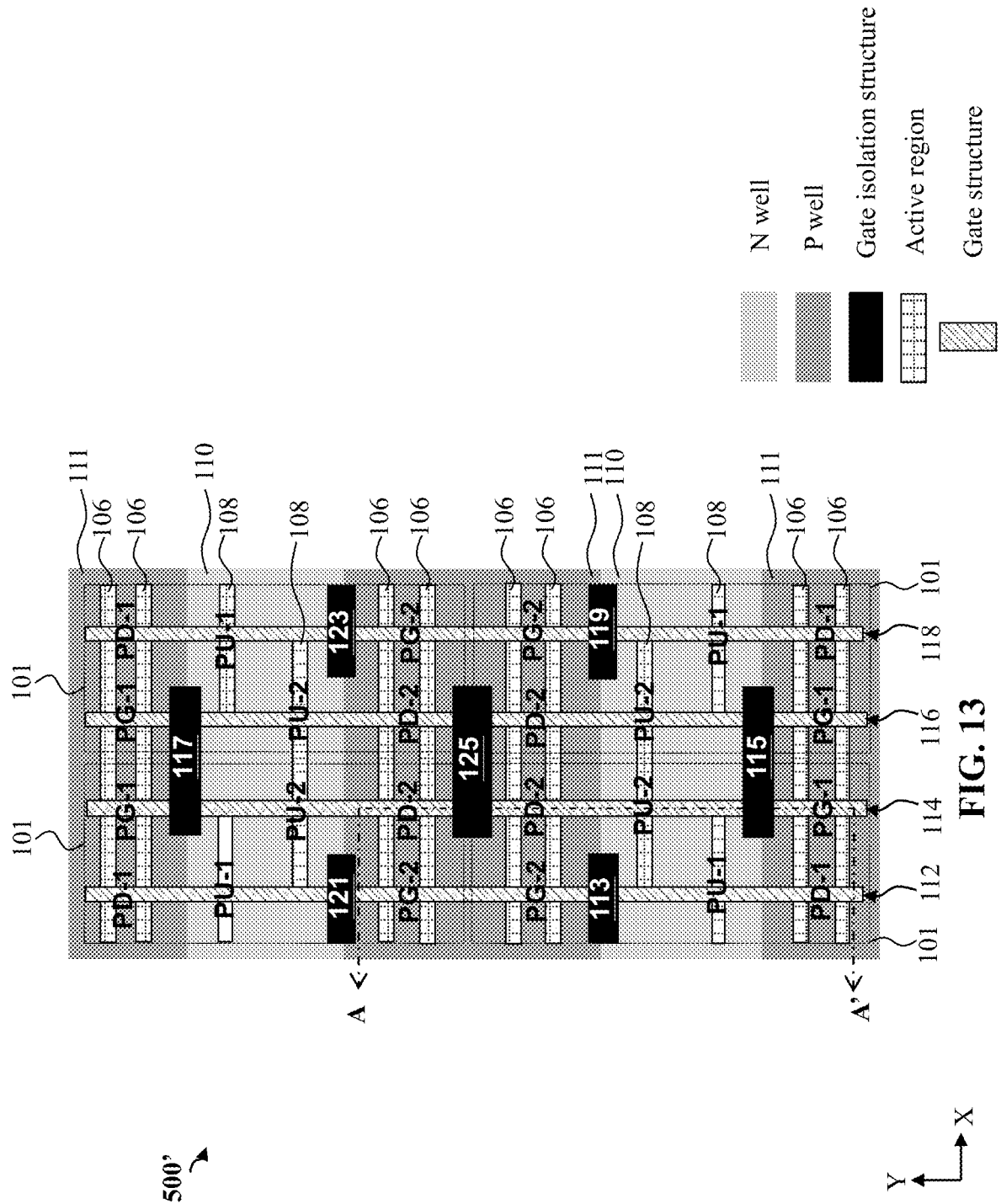
FIG. 13 is a fragmentary top, plan view of an alternative array of memory cells that includes a number of gate isolation structures, according to various aspects of the present disclosure.
Figure 14:
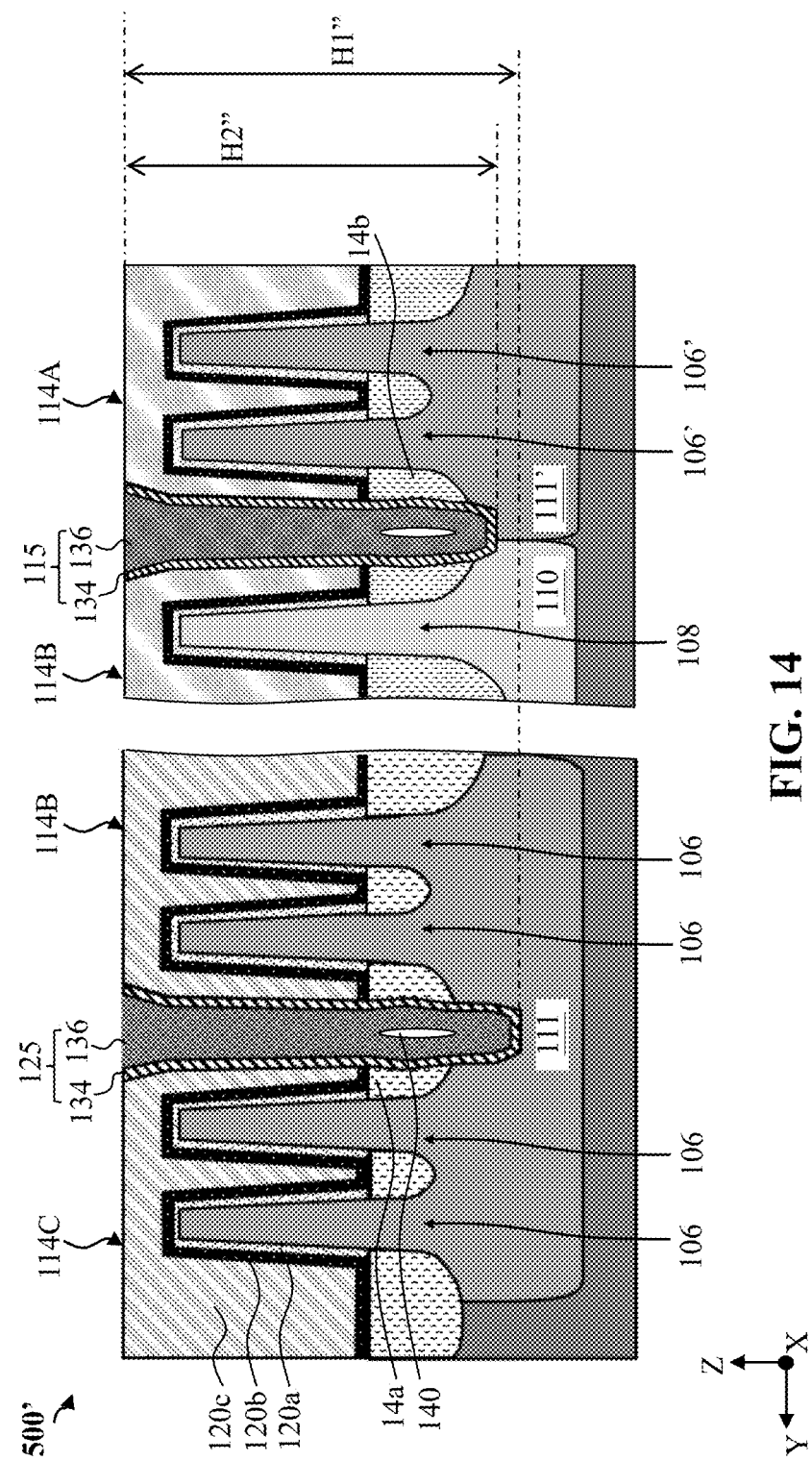
FIG. 14 illustrates a fragmentary cross-sectional view of the alternative array of memory cells taken along line A-A' as shown in FIG. 13.

FIG. 14 depicts a fragmentary cross-sectional view of the high-current SRAM array 500' taken along line A-A' shown in FIG. 13. The cross-sectional view of the high-current SRAM array 500' represented in FIG. 14 is similar to that of the SRAM array 500 represented in FIG. 11, except for the disclosure of dual-fin devices. In the present embodiments, the gate isolation structure 125 extends through the gate structure 114 and the STI feature 14a, extends into the p well 111, and has a height H1" along the Z direction. The gate isolation structure 115 extends through the gate structure 114 and the STI feature 14b and extends into both the n well 110 and the p well 111', and has a height H2" along the Z direction. The height H1" is greater than the height H2". In some embodiments, due to etchants used in the etching process for forming the first and second trenches 132a and 132b, the portion of the gate isolation structure (e.g., the gate isolation structure 125, the gate isolation structure 115) extending through the STI feature (e.g., the STI feature 14a, the STI feature 14b) may have an expanded width along the Y direction, as represented in FIG. 14.

In the above embodiments, SRAM array 500/500' is implemented using FinFETs transistors. In some other embodiments, SRAM array 500/500' may be implemented using "planar" transistors or GAA transistors. Method for forming the gate isolation structures for planar transistors-based SRAM array or GAA transistors-based SRAM array may be similar to the method 400 and is omitted for reason of simplicity.

Although not intended to be limiting, one or more embodiments of the present disclosure provide many benefits to an IC structure and the formation thereof. For example, the present embodiments provide an array of memory cells, such as SRAM cells, in an IC structure, where each SRAM cell includes n-type transistors, such as pull-down transistors and pass-gate transistors, formed over p-type fins and p-type transistors, such as pull-up transistors, formed over n-type fins. In the present embodiments, gate isolation structures are formed to cut gate structures into electrically and physically isolated segments such that the array of memory cells may work properly. The gate isolation structures include a second dielectric layer whose sidewall and bottom surfaces are lined by a first dielectric layer that is free of nitrogen. By forming the nitrogen-free liner, positive charge in the second dielectric layer may be blocked, thereby reducing or eliminating latch-up. Thus, leakage associated with gate isolation structures may be alleviated.

The present disclosure provides for many different embodiments. Semiconductor structures and methods of fabrication thereof are disclosed herein. In one exemplary aspect, the present disclosure is directed to a method. The method includes forming a first semiconductor fin and a second semiconductor fin protruding from a substrate, forming a high-k metal gate (HKMG) structure over the first semiconductor fin and the second semiconductor fin, forming a trench to separate the HKMG structure into two portions, conformally depositing a first dielectric layer in the trench, depositing a second dielectric layer over the first dielectric layer to fill the trench, wherein the second dielectric layer includes nitrogen, and the first dielectric layer is free of nitrogen, and planarizing the first dielectric layer and second dielectric layer to form a gate isolation structure in the trench.

In some embodiments, a dielectric constant of the second dielectric layer may be greater than a dielectric constant of the first dielectric layer. In some embodiments, the first dielectric layer may include silicon oxide, and the second dielectric layer may include silicon nitride. In some embodiments, the method may also include, before the forming of the HKMG structure, forming an isolation feature between the first semiconductor fin and the second semiconductor fin, where the trench may further extend into the isolation feature. In some embodiments, the substrate may include a first doped region with a first doping polarity and a second doped region with a second doping polarity different from the first doping polarity, where the first semiconductor fin may protrude from the first doped region, and the second semiconductor fin may protrude from the second doped region. In some embodiments, the trench may further extend into both the first doped region and the second doped region. In some embodiments, the gate isolation structure may include an upper portion and a lower portion, where the upper portion may be wider than the lower portion. In some embodiments, a bottom surface of the gate isolation structure may be below a bottom surface of the HKMG structure.

In another exemplary aspect, the present disclosure is directed to a method. The method includes providing a workpiece comprising a first fin, a second fin, a third fin, and a fourth fin protruding from a substrate, forming a gate structure engaging the first, second, third, and fourth fins, performing an etching process to form a first trench and a second trench extending vertically through the gate structure, the first trench being disposed between the first fin and the second fin, the second trench being disposed between the third fin and the fourth fin, depositing a dielectric liner in the first and second trenches, and forming a dielectric fill layer over the dielectric liner to substantially fill the first and second trenches, thereby forming a first gate isolation structure in the first trench and a second gate isolation structure in the second trench, where the dielectric fill layer includes nitrogen, and the dielectric liner is free of nitrogen.

In some embodiments, the dielectric liner may include silicon oxide, the dielectric fill layer may include silicon nitride. In some embodiments, a bottom surface of the first gate isolation structure may be below a bottom surface of the second gate isolation structure. In some embodiments, the first fin and the second fin may protrude from a first doped region of the substrate, the third fin may protrude from a second doped region of the substrate, and the fourth fin may protrude from a third doped region of the substrate, the first doped region and the third doped region may include a first doping polarity, and the second doped region may include a second doping polarity different from the first doping polarity. In some embodiments, each of the first doped region and the third doped region may include a p well, and the second doped region may include an n well. In some embodiments, the workpiece may also include a first isolation feature disposed between the first fin and second fin and a second isolation feature disposed between the third fin and the fourth fin, where a bottom surface of the second isolation feature may be lower than a bottom surface of the first isolation feature. In some embodiments, the first gate isolation structure may further extend through the first isolation feature and extend into the first doped region, and the second gate isolation structure may further extend through the second isolation feature and extend into the second doped region and the third doped region. In some embodiments, the first gate isolation structure may also include an air gap disposed in the dielectric fill layer, and a top surface of the air gap may be below a top surface of the first isolation feature.

In yet another exemplary aspect, the present disclosure is directed to a semiconductor structure. The semiconductor structure includes a first transistor comprising a first fin protruding from a substrate and a first gate structure disposed over the first fin, a second transistor comprising a second fin protruding from the substrate and separated from the first fin by a first isolation feature and a second gate structure disposed over the second fin, and a first dielectric feature in direct contact with, and extending lengthwise along a direction perpendicular to, the first and second gate structures to provide isolation between the first and second gate structures, where the first dielectric feature includes a dielectric fill layer and a dielectric liner extending along sidewall and bottom surfaces of the dielectric fill layer, and the dielectric fill layer includes nitrogen, and the dielectric liner is free of nitrogen.

In some embodiments, the first transistor may include an n-type transistor, and the second transistor may include a p-type transistor. In some embodiments, the semiconductor structure may also include a third transistor having a third fin protruding from the substrate, where the second gate structure may be further disposed over the third fin. The semiconductor structure may also include a fourth transistor having a fourth fin protruding from the substrate and separated from the third fin by a second isolation feature, a third gate structure disposed over the fourth fin, and a second dielectric feature in direct contact with, and extending along a direction perpendicular to, the second and third gate structures to provide isolation between the second and third gate structures, where a composition of the second dielectric feature may be the same as a composition of the first dielectric feature. In some embodiments, each of the third transistor and the fourth transistor may include an n-type transistor, and a bottom surface of the second dielectric feature may be below a bottom surface of the first dielectric feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first semiconductor fin and a second semiconductor fin protruding from a substrate;
    forming a high-k metal gate (HKMG) structure over the first semiconductor fin and the second semiconductor fin;
    forming a trench to separate the HKMG structure into two portions;
    conformally depositing a first dielectric layer in the trench;
    depositing a second dielectric layer over the first dielectric layer to fill the trench, wherein the second dielectric layer includes nitrogen, and the first dielectric layer is free of nitrogen; and
    planarizing the first dielectric layer and second dielectric layer to form a gate isolation structure in the trench, wherein the gate isolation structure comprises a bottom portion extended into the substrate, a middle portion disposed between the first semiconductor fin and the second semiconductor fin, and a top portion over the first semiconductor fin and the second semiconductor fin, wherein a width of the top portion is greater than a width of the middle portion.

2. The method of claim 1, wherein a dielectric constant of the second dielectric layer is greater than a dielectric constant of the first dielectric layer.

3. The method of claim 1, wherein the first dielectric layer comprises silicon oxide, and the second dielectric layer comprises silicon nitride.

4. The method of claim 1, further comprising:
    before the forming of the HKMG structure, forming an isolation feature between the first semiconductor fin and the second semiconductor fin,
    wherein the trench further extends into the isolation feature.

5. The method of claim 4, wherein the substrate comprises a first doped region with a first doping polarity and a second doped region with a second doping polarity different from the first doping polarity, wherein the first semiconductor fin protrudes from the first doped region, and the second semiconductor fin protrudes from the second doped region.

6. The method of claim 5, wherein the trench further extends into both the first doped region and the second doped region.

7. The method of claim 1, wherein the gate isolation structure comprises an upper portion and a lower portion, wherein the upper portion is wider than the lower portion.

8. The method of claim 1, wherein a bottom surface of the gate isolation structure is below a bottom surface of the HKMG structure.

9. A method, comprising:
    providing a workpiece comprising a first fin, a second fin, a third fin, and a fourth fin protruding from a substrate, wherein the first fin and the second fin protrude from a first doped region of the substrate, the third fin protrudes from a second doped region of the substrate, and the fourth fin protrudes from a third doped region of the substrate, the first doped region and the third doped region comprise a first doping polarity, and the second doped region comprises a second doping polarity different from the first doping polarity;
    forming a gate structure extending over the first, second, third, and fourth fins;
    performing an etching process to form a first trench and a second trench extending vertically through the gate structure, the first trench being disposed between the first fin and the second fin, the second trench being disposed between the third fin and the fourth fin;
    depositing a dielectric liner in the first and second trenches; and
    forming a dielectric fill layer over the dielectric liner to substantially fill the first and second trenches, thereby forming a first gate isolation structure in the first trench and a second gate isolation structure in the second trench, wherein the dielectric fill layer includes nitrogen, and the dielectric liner is free of nitrogen.

10. The method of claim 9, wherein the dielectric liner comprises silicon oxide, the dielectric fill layer comprises silicon nitride.

11. The method of claim 9, wherein a bottom surface of the first gate isolation structure is below a bottom surface of the second gate isolation structure.

12. The method of claim 9, wherein each of the first doped region and the third doped region comprises a p well, and the second doped region comprises an n well.

13. The method of claim 9, wherein the workpiece further comprises:
 a first isolation feature disposed between the first fin and second fin, and
 a second isolation feature disposed between the third fin and the fourth fin,
 wherein a bottom surface of the second isolation feature is lower than a bottom surface of the first isolation feature.

14. The method of claim 13, wherein the first gate isolation structure further extends through the first isolation feature and extends into the first doped region, and the second gate isolation structure further extends through the second isolation feature and extends into the second doped region and the third doped region.

15. The method of claim 13, wherein the first gate isolation structure further comprises an air gap disposed in the dielectric fill layer, and a top surface of the air gap is below a top surface of the first isolation feature.

16. A semiconductor structure, comprising:
 a first transistor comprising:
  a first fin protruding from a substrate, and
  a first gate structure disposed over the first fin;
 a second transistor comprising:
  a second fin protruding from the substrate and separated from the first fin by a first isolation feature, and
  a second gate structure disposed over the second fin;
 a first dielectric feature configured to provide isolation between the first and second gate structures, wherein the first dielectric feature includes a dielectric fill layer and a dielectric liner extending along sidewall and bottom surfaces of the dielectric fill layer, and the dielectric fill layer includes nitrogen;
 a third transistor comprising a third gate structure; and
 a second dielectric feature configured to provide isolation between the second and third gate structures, wherein a bottom surface of the second dielectric feature is lower than a bottom surface of the first dielectric feature.

17. The semiconductor structure of claim 16, wherein the first transistor comprises an n-type transistor, and the second transistor comprises a p-type transistor.

18. The semiconductor structure of claim 17,
 wherein a composition of the second dielectric feature is the same as a composition of the first dielectric feature.

19. The semiconductor structure of claim 16, wherein the third transistor further comprises a third fin, wherein the third fin is separated from the second fin by a second isolation feature, and wherein the first dielectric feature extends through the first isolation feature, the second dielectric feature extends through the second isolation feature.

20. The semiconductor structure of claim 19, wherein a depth of the first isolation feature is greater than a depth of the second isolation feature.

* * * * *